Dec. 1, 1970 J. A. DONEWALD ET AL 3,544,848

HOUSING FOR ELECTRONIC EQUIPMENT WITH ROTATABLE CIRCUIT BOARD MEANS

Filed Oct. 2, 1968 4 Sheets-Sheet 1

Inventors
JAMES A. DONEWALD
HENRY E. SCHAEFGES

BY Mueller, Aichele & Rauner

ATTYS

Inventors
JAMES A. DONEWALD
HENRY E. SCHAEFGES
BY
Mueller, Aichele & Rauner
ATTYS.

Dec. 1, 1970 J. A. DONEWALD ETAL 3,544,848

HOUSING FOR ELECTRONIC EQUIPMENT WITH ROTATABLE CIRCUIT BOARD MEANS

Filed Oct. 2, 1968 4 Sheets-Sheet 3

Inventors
JAMES A. DONEWALD
HENRY E. SCHAEFGES
BY
Mueller, Aichele & Rauner
ATTYS.

Inventors
JAMES A. DONEWALD
HENRY E. SCHAEFGES.
BY
Mueller, Aichele & Rauner
ATTYS.

United States Patent Office 3,544,848
Patented Dec. 1, 1970

3,544,848
HOUSING FOR ELECTRONIC EQUIPMENT WITH ROTATABLE CIRCUIT BOARD MEANS

James A. Donewald, Northfield, and Henry E. Schaefges, Niles, Ill., assignors to Motorola, Inc., Franklin Park, Ill., a corporation of Illinois Filed Oct. 2, 1968, Ser. No. 764,467
Int. Cl. H02b *1/10, 1/06*
U.S. Cl. 317—99 8 Claims

ABSTRACT OF THE DISCLOSURE

A sealed housing is provided for electronic equipment with the housing being adapted for mounting in any of four orientations. Means is provided for rotating a portion of the housing to maintain the electronic equipment in the required orientation without opening the housing.

BACKGROUND OF THE INVENTION

Power companies must not only be capable of supplying the average power load but also the peak power load demanded by their customers. Where a power company must provide for high peak loads relative to the average power consumption the efficiency of the operation is low. The power company must provide enough generating equipment for the peak load even though much of this equipment is not required for the average load. If the power company purchases power from other sources heavy penalties must be paid for power peaks. It is, therefore, highly desirable for a power company to be able to reduce its peak power requirements.

Certain peak power requirements occur at regular intervals and plans can be made to reduce power consumption in other areas during these times. However, other peak power demands are unpredictable and may occur when it is not possible to easily reduce the power demands in other areas to compensate for them. For example, in the summer, air conditioning power requirements can change drastically over short periods of time and the air conditioning load on power systems has become increasingly greater.

It is, therefore, desirable for power companies to have some means by which a substantially large portion of their load can be controlled so that the peak power demands on the system can be reduced as required. With the increased use of electricity for heating purposes in homes it has been found that the power for heating can be reduced without notice for short periods of time and thus power requirements can be reduced. A particularly useful load for reducing the power requirements is found in many homes in the form of electric hot water heaters. It has been found that all or a portion of the power supplied to the water heater can be turned off for a short period of time without causing a substantial reduction in the quantity of hot water available for use in the home. Accordingly, timers have been placed in the home for periodically turning off all or a portion of the hot water heater whenever a peak load is expected. While this system has work to reduce the peak demand it is not fully under the control of the power company and therefore it is not as efficient as is desired. Further, there is no provision for controlling unexpected peaks of power demand.

It has, therefore, been found desirable to substitute radio controlled switches for the timer apparatus which has been used in the past. The radio controlled switch is under full control of the power company so that the peak power demands can be reduced as desired by shutting off all or a portion of the power supplied to water heaters throughout a large metropolitan area. This can be done almost instantaneously as the power requirements of the system requires a power reduction. If desired, automatic power sensing apparatus could turn off the heaters without manual operation.

In order to provide an adequate radio controlled switch a housing must be provided for the electronic equipment which will interface with existing home electrical equipment such as the box which receives the cylindrical power meter cases. The housing must be weatherproof so that it can be mounted outside and must be easily opened so that the electronic equipment inside is accessible for maintenance. The electronic equipment includes a receiving antenna which, for proper operation, must have a particular orientation. Since the mounting position which is available at each installation may differ, it is desirable that the housings be readily adaptable to quick installation with the proper antenna orientation. The housing must also be economical to manufacture.

SUMMARY OF THE INVENTION

It is, therefore, an object of this invention to provide an improved housing for electronic equipment which can be easily connected to standard power equipment junction boxes.

Another object of this invention is to provide a housing for electronic equipment, the orientation of which can be readily changed so that the components within the housing will have the required orientation.

Another object of this invention is to provide a housing for electronic equipment which is weatherproof, simple to install and inexpensive to manufacture.

In practicing this invention a cylindrical housing is provided. The housing consists of front and rear portions each adapted to be molded in plastic. The two portions are in the form of cylinders with an open end and a closed end. The rear portion has mounting means extending therefrom whereby it can be mounted in any one of the two pairs of opposed orientations with each of the two pairs being perpendicular to each other. One of the front and rear portions has a plurality of slots on the periphery of the open end with wedges intermediate the slots. The other of the front and rear portions has a plurality of interlocking lugs along the periphery of the open end thereof. The slots are formed to receive the lugs so that rotation of the front portion with respect to the rear portion acts to engage the wedges and the lugs. The wedges are formed so that rotation of the front portion in a clockwise direction or a counterclockwise direction acts to draw the front and rear portions together by cam action. One of the front and rear portions is rotated in the direction which will orient the antenna of the electronic chassis mounted inside the housing to the desired orientation. One of the front and rear housing portions has a groove with a resilient seal mounted in the groove. The other of the front and rear housing portions has a shoulder which bears against the resilient seal so that the cam action compresses the seal to make the housing water tight.

A clip is rotatably mounted on a molded projection on the rear wall of the rear housing portion. The clip engages the printed circuit board so that with removal of the front housing portion the printed circuit board will remain fixed to the rear housing portion. The front housing portion includes guide rails in the side walls which engage the edges of the printed circuit board to support the board and to cause the board to be rotated as the front housing portion is rotated. Sealing holes are provided at the peripheries of the open ends of the front and rear housing portion so that the housing may be sealed and locked for any mounting position of the housing.

The invention is illustrated in the drawings in which.

DETAILED DESCRIPTION OF THE INVENTION

Figures 1, 7:
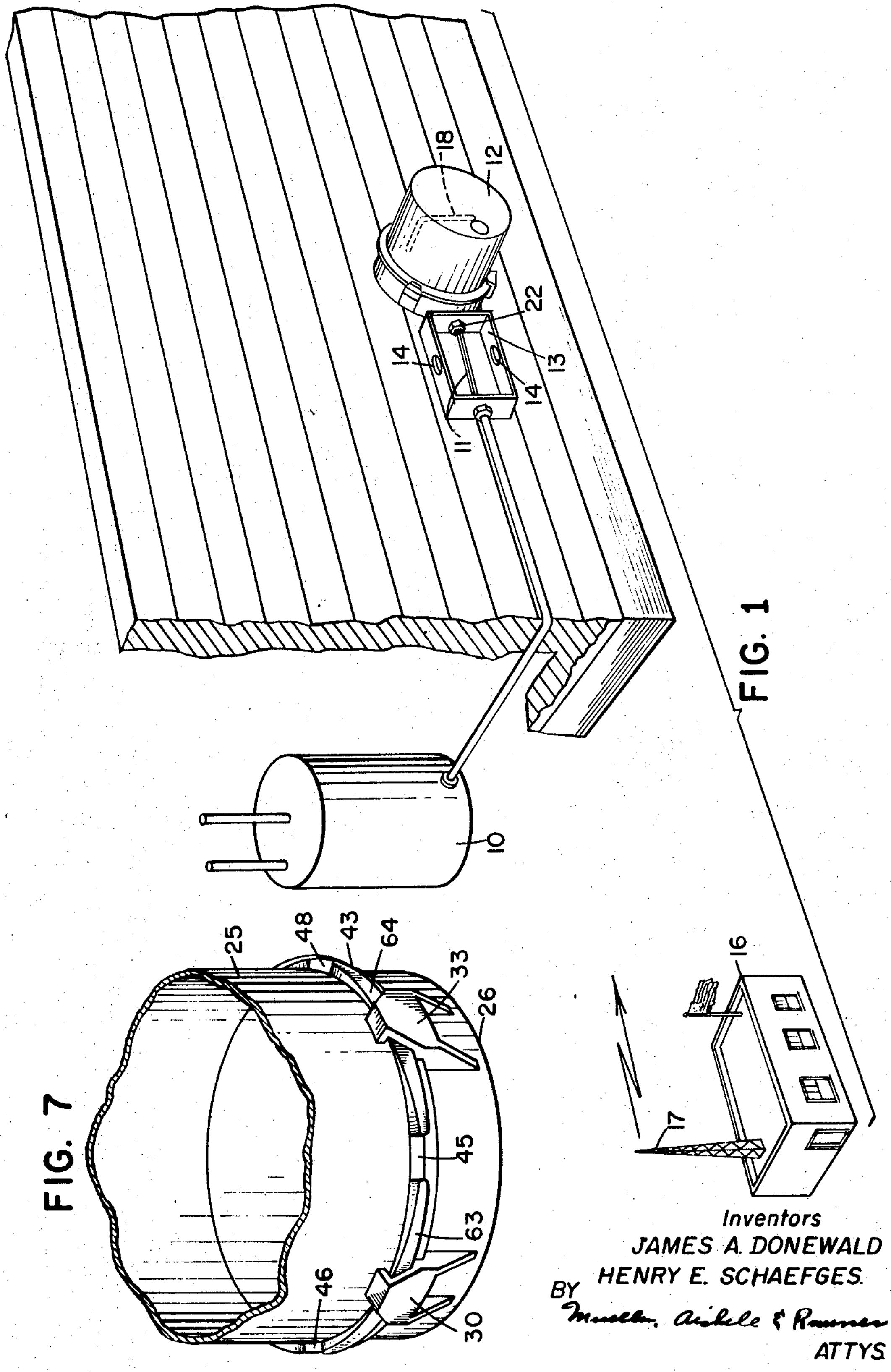
FIG. 1 shows a typical installation of the housing.
FIG. 7 is a view of the housing showing the lugs, wedges and slots.

A typical installation of the housing is shown in FIG. 1. A hot water heater 10 located inside of a house is connected by wires 11 to the electronic equipment located within the housing 12. Housing 12 is fastened to junction box 13, shown with its cover removed. A threaded mounting portion 21 of FIG. 2 extends through an opening in the junction box 13. A nut 22 engages the threaded portion 21 to secure the housing to the junction box. Junction box 13 may have other openings 14 located thereon and housing 12 may be mounted through any of the other openings. As will be described in a subsequent portion of this specification, housing 12 is especially adapted to be mounted in any available opening of a standard junction box.

In operation, when a decision is made to shut off all or a portion of the power to water heater 10, radio equipment located in building 16, which may be many miles from the house, is transmitted from antenna 17 and is received by antenna 18. The radio signal is decoded and acts to operate a switch within housing 12 to disconnect all or a portion of water heater 10. In order to provide proper operation of the electronic equipment in housing 12, it is required that antenna 18 be mounted with a particular orientation as shown. Thus the housing is constructed so as to provide for maintaining the proper antenna orientation even if the mounting position of the housing is changed.

Figure 2:
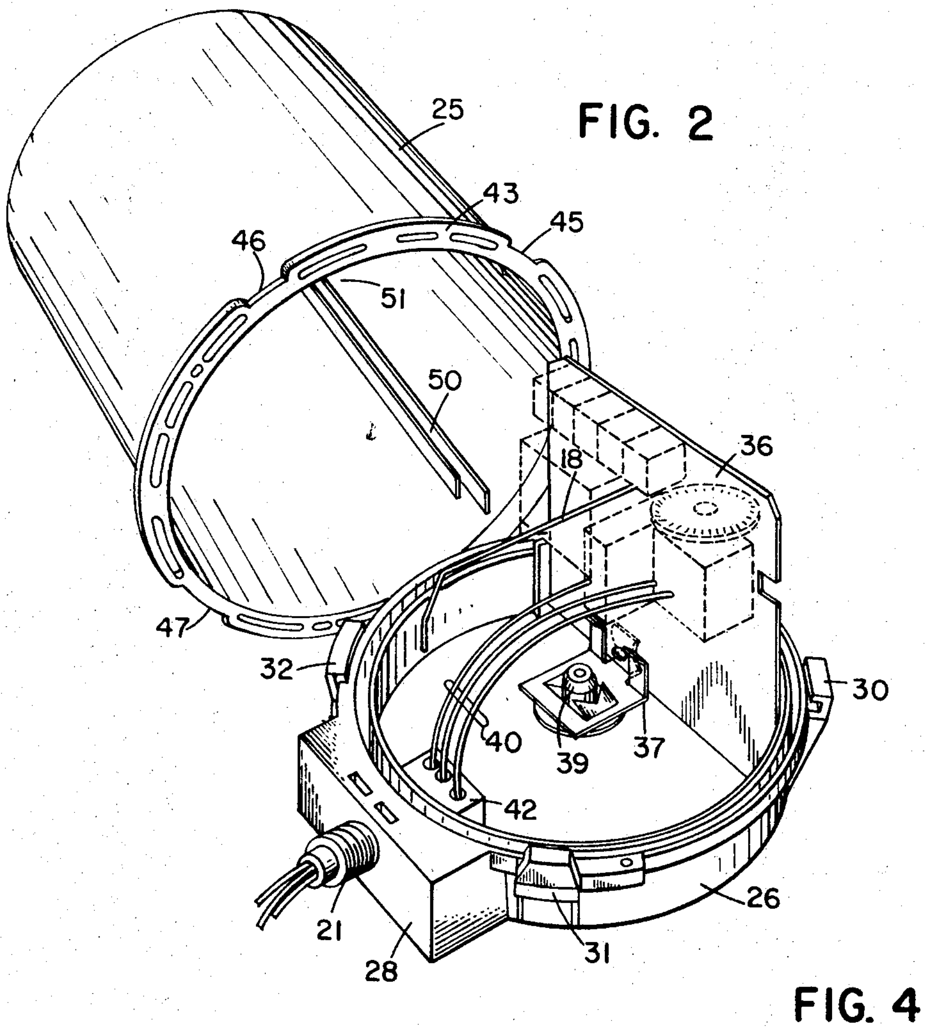
FIG. 2 shows the construction of the front and rear portions of the housing.
Figure 6:
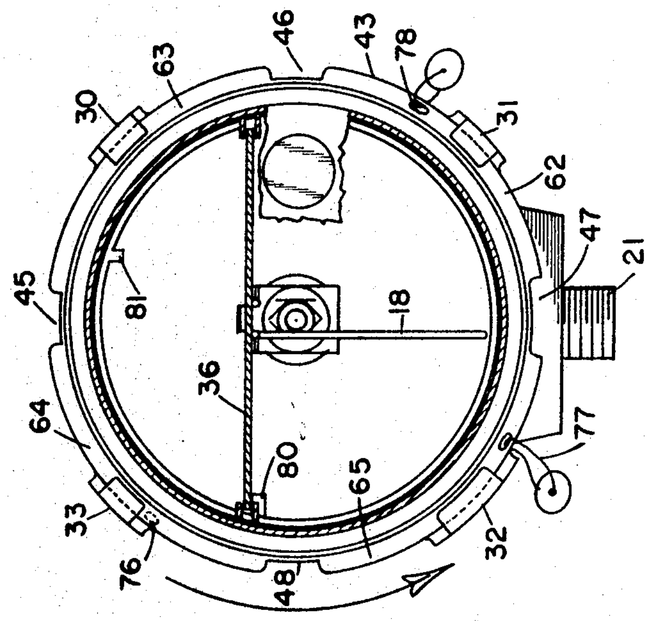
FIGS. 5 and 6 illustrate how the desired orientation of the housing can be obtained for different mounting orientations.
Figure 5:
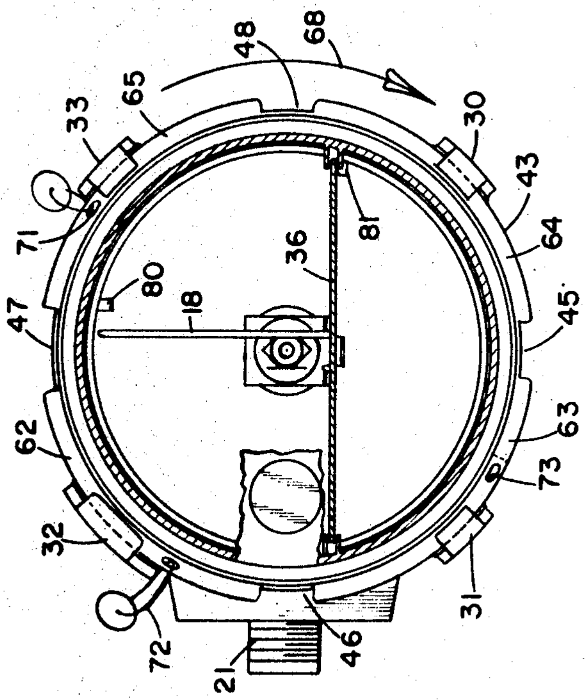

Referring to FIG. 2, the housing includes a front portion 25 and a rear portion 26. Each of the portions 25 and 26 is cylindrical in shape and has an open end and a closed end. The rear portion includes the threaded mounting portion 21 and a surface 28 which bears against the side of the junction box to support the housing. The rear portion also includes a plurality of lugs 30, 31 and 32. A fourth lug 33 is not shown in FIG. 2 but is shown in FIGS. 5, 6 and 7.

A printed circuit board 36 is mounted on the rear portion 26 by means of clip 37. Clip 37 is so constructed that it pivots around projection 39 permitting circuit board 36 to rotate within the housing. Antenna 18 projects from circuit board 36 and is entirely within the housing. Wires 40 extend from printed circuit board 36 through a wire strain relief 42 and the threaded portion 21 to the water heater as shown in FIG. 1.

Front portion 25 has a shoulder portion 43 with a plurality of slots 45, 46 and 47 therein. Slot 45 mates with lug 30, slot 46 mates with lug 31 and slot 47 mates with lug 32. A fourth slot 48 not shown in FIG. 2 mates with lug 33. One lug and one slot, for example, lug 32 and slot 47, may be made wider than the remaining lugs and slots to key the positioning of the front cover on the rear cover.

Front portion 25 includes a pair of guide rails 50 and 51 mounted opposite each other on the inside walls of the front portion. Guide rails 50 and 51 engage the edges of circuit board 36 when the front portion is placed on the rear housing. To close the housing the front portion 25 is placed on the rear portion 26 with the slots 50 and 51 engaging the edge of circuit board 36. Lugs 30, 31 and 32 and 33 pass through slots 45, 46, 47 and 48 and the front and rear portions are rotated 45° with respect to each other. The rotation may be either clockwise or counterclockwise depending upon the desired orientation of the antenna as will be described in a subsequent portion of the specification.

Figure 3:
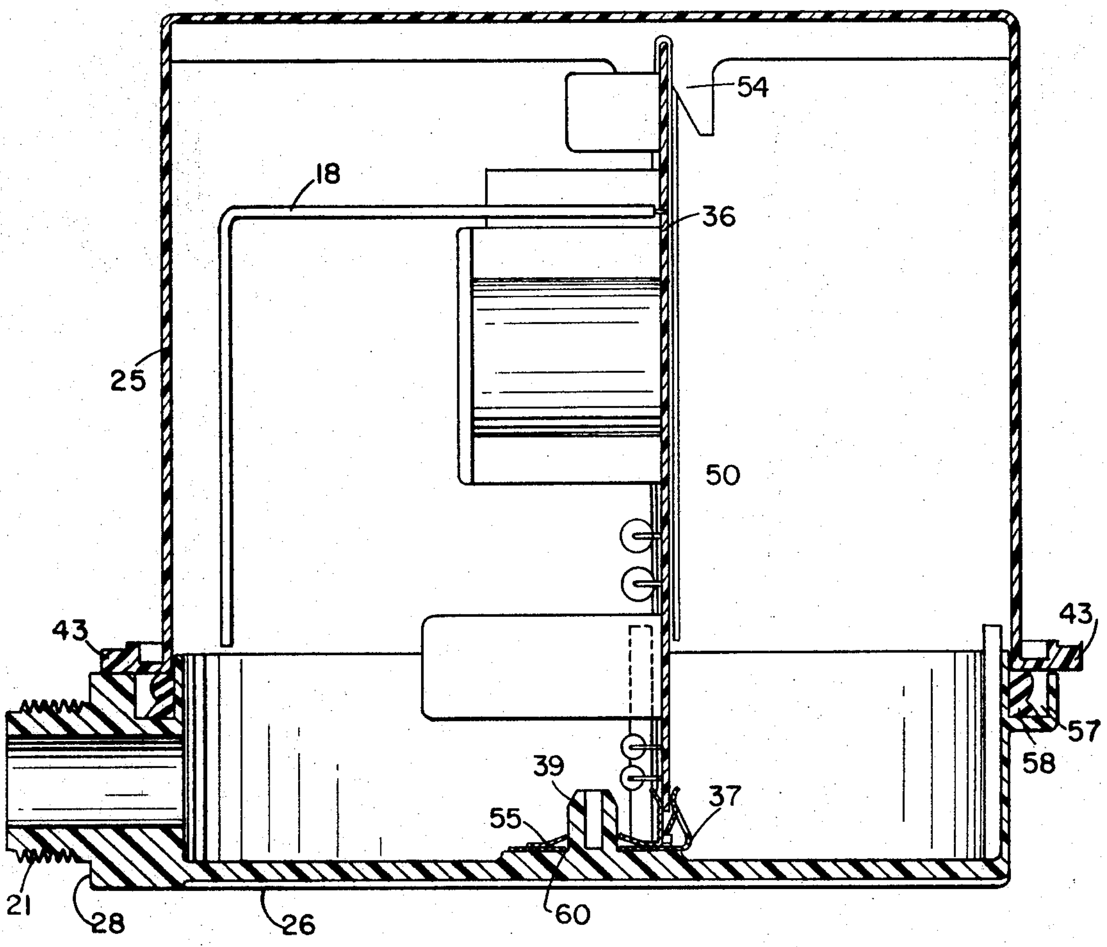
FIG. 3 is a cross-sectional view of the housing.

FIG. 3 is a cross-sectional view of the electronic housing. Circuit board 36 which contains the electronic circuit is held in position by guide rail 50 on the side of the front housing 25 and is gripped by a receiving portion 54 located on the closed end of the front portion. Antenna 18 is connected to circuit board 36 and is contained entirely within the housing.

The other end of circuit board 36 is held by clip 37. Clip 37 is so constructed that circuit board 36 can be easily removed therefrom. Clip 37 has an opening 60 in the center thereof through which projection 39 on the closed end of rear portion 26 extends. Opening 60 in clip 37 is sufficiently large so that the clip is free to rotate about projection 39 and thus circuit board 36 held by clip 37 is also free to rotate. Clip 37 is held on projection 39 by means of a fastener 55. When the front cover portion 25 is removed circuit board 36 slides out of receiving portion 54 and guide rails 50 and 51 and is retained in the rear portion.

The rear portion 26 has a circumferential groove 57 in which is inserted a resilient gasket 58 which only partially fills the space within groove 57 as shown by FIG. 3. When the housing is closed shoulder 43 of front portion 25 is forced against the resilient gasket 58 sealing the housing.

In FIGS. 5, 6 and 7 there is shown a plurality of wedges along shoulder 43 of front portion 25. Wedge 62 is positioned between slots 46 and 47, wedge 63 is positioned between slots 45 and 46, wedge 64 is positioned between slots 45 and 48 and wedge 65 is positioned between slots 47 and 48. Lugs 30–33 are inserted through slots 45–48 respectively and the front portion 25 is rotated either clockwise or counterclockwise. The rotation causes the lugs to bear against the wedges positioned between the slots causing front portion 25 to be wedged against rear portion 26 compressing the resilient gasket 58 of FIG. 3 causing it to extend outwardly within groove 57 thus sealing and closing the housing.

Figure 4:
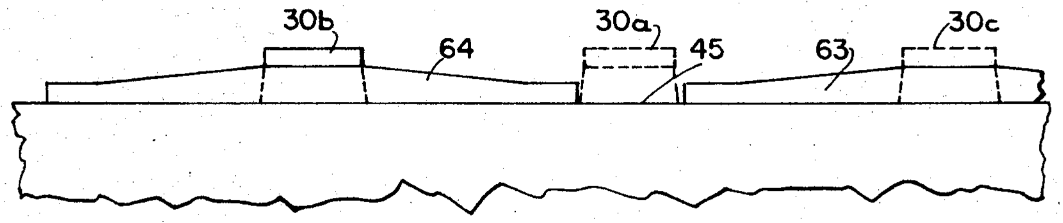
FIG. 4 is a cut-away view of the housing showing the action of the lugs, slots and wedges.

FIG. 4 is a cutaway drawing showing the action of the lugs, slots and wedges in closing and sealing the housing. A lug, for example, lug 30, is inserted in slot 45. Rotation of the front housing portion 25 in either direction acts to move lug 30 with respect to the wedges 63 and 64. If, for example, the front portion 25 is rotated to the right lug **30*a* moves up wedge 64 to the position 30*b*. As front portion 25 is rotated the remaining three lugs 31, 32 and 33 move up corresponding wedges and the two housing portions are drawn together compressing resilient seal and closing and sealing the housing. If the front portion 25 is rotated to the left lug 30*a* moves up wedge 63 to position 30*c* which would also close and seal the housing. Thus rotation of the front portion 25** in either a clockwise or counterclockwise direction will close and seal the housing. However, the orientation of the contents of the housing will be different with the different rotations. In each case the front portion is rotated approximately 45° clockwise or counterclockwise from the position in which the lugs engage the slots.

FIGS. 5 and 6 illustrate the manner in which the proper orientation of the electronic circuitry within the housing is achieved. In this example, there are two pairs of opposed orientations in which rear portion 26 can be mounted. The first pair is with the threaded portion 21 to the left (FIG. 5) or to the right. The second pair is with the threaded portion 21 up or down (FIG. 6). In order to provide proper orientation of antenna 18 (vertical orientation) with four different housing mounting positions the front portion 25 and the contents of the housing can be rotated in either direction. If rear portion 26 is mounted with the threaded mounting portion 21 to the left as shown in FIG. 5, the front portion 25 is rotated clockwise in the direction indicated by arrow 68 in order to close and seal the housing. With this rotation antenna 18 is mounted in a vertical position. If the threaded mounting portion 21 were positioned to the right the rotation of front portion 25 would again be in the direction of arrow 68, however antenna 18 while in the vertical position would be pointing downwards as shown in FIG. 6 instead of upwards as shown in FIG. 5. In FIG. 6 the threaded mounting portion 21 is facing downward and counterclockwise rotation, in the direction of arrow 70, is required in order to properly orient the antenna. If the threaded mounting portion 21 were facing upwards, counterclockwise rotation in the direction of arrow 70 would again be required to cause the antenna 18 to assume the vertical orientation. Stops 80 and 81 positioned on rear cover portion 26 limit the rotation of circuit board 36 and the front cover portion 26 so that circuit board 36 an antenna 18 have the proper orientation.

During manufacture the electronic equipment is packaged within the housing so that the antenna has a particular orientation. The front portion 25 has a pair of sealing holes in shoulder 43 while the rear portion 26 has three sealing holes two of which match the pair of sealing holes in the front portion. In FIG. 5 holes 71 and 72 in the front and rear portions are in alignment while hole 73 in the rear portion is not aligned with any hole in the front portion. In FIG. 6 sealing holes 77 and 78 in the two portions are in alignment while sealing hole 76 in rear portion 26 is not in alignment with any hole in front portion 25.

During manufacture the units are sealed with a particular antenna orientation and the electronic package can be installed without opening the housing. Referring to FIGS. 1 and 2 the electronic housing 12 is fastened to junction box 13 by inserting threaded portions 21 through an opening in the junction box and securing the housing by means of screw 22. The wiring is then connected in the junction box for proper operation and control of the water heater 10. If the orientation of the antenna 18 is not correct, the installer need merely cut the seals on the housing, rotate the front housing portion 25 90° without opening the housing, and reseal the unit. The antenna would then have the proper orientation.

We claim:

1. A housing for mounting electronic equipment in a particular orientation, including in combination, cylindrical front and rear housing portions forming said housing, each of said cylindrical front and rear portions having an open and a closed end, said rear portion having mounting means extending therefrom so that said housing can be mounted in any one of first and second pairs of opposed orientations with said first pair of opposed orientations being perpendicular to said second pair of opposed orientations, a printed circuit board having components mounted thereon including an antenna, said printed circuit board being rotatably mounted within said housing on said rear portion, said front portion including a pair of grooves positioned on the sides thereof, said grooves engaging the edges of said printed circuit board for support thereof whereby rotation of said front portion rotates said printed circuit board, one of said front and rear housing portions having a plurality of slots along the periphery of said open end thereof with wedges intermediate said slots, the other of said front and rear housing portions having a plurality of interlocking lugs along the periphery of said open end thereof, said slots being formed to receive said lugs so that with said open ends of said front and rear portion joined together rotation of said front portion with respect to said rear portion acts to engage said wedges and said lugs, said wedges forming cams which engage said lugs so that rotation of said front portion in a clockwise direction acts to draw said front and rear portions together by cam action and position said antenna in the particular orientation with said rear portion mounted in one of said first pair of orientations, said cams also engaging said lugs upon rotation of said front portion in a counterclockwise direction to draw said front and rear portions together by cam action and position said antenna in the particular orientation with said rear portion mounted in one of said second pair of orientations.

2. The housing of claim 1 wherein, said mounting means includes a threaded cylindrical portion extending from said rear portion with said threaded cylindrical portion having a centrally positioned first opening therethrough, utilization means, an electrical connection box having a plurality of wires therein extending to said utilization means, said connection box having a second opening therein with said threaded cylindrical portion extending through said second opening, a nut screwed on said threaded cylindrical portion for securing said rear housing portion to said connection box, said wires further extending through said first opening into said housing.

3. The housing of claim 1 wherein, said rear housing portion includes a raised mounting portion on the closed end thereof, clip means rotatably connected to said raised mounting portion, said clip means being mechanically connected to said printed circuit board whereby said printed circuit board is free to rotate around said raised portion and further said printed circuit board is retained in said rear portion with said front portion removed.

4. The housing of claim 1 wherein, said rear housing portion includes a pair of raised stops extending from the sides thereof, said stops acting to limit the rotation of said front portion in said clockwise and counter clockwise directions so that said orientation of said antenna is said particular orientation.

5. The housing of claim 1 wherein, said front portion includes first and second sealing holes mounted along said periphery of said open end thereof, said rear portion includes third, fourth and fifth sealing holes mounted along said periphery of said open end thereof, said first and second sealing holes being positioned to match said third and fourth sealing holes with said front portion rotated in said clockwise direction and said third and fifth sealing holes being positioned to match said first and second sealing holes with said front portion rotated in said counterclockwise direction said sealing holes being adapted to receive sealing wire whereby said housing can be locked with said antenna in said particular orientation.

6. The housing of claim 1 wherein, said printed circuit board includes a counting mechanism mounted thereon, said counting mechanism including a dial for displaying the number of operations of said counting mechanism, said front portion including a window in said closed end thereof, said counting mechanism being positioned on said printed circuit board so that said dial is opposite said window with said housing being sealed whereby said dial can be read without opening said housing.

7. A housing for mounting electronic equipment in a particular orientation, including in combination, cylindrical front and rear housing portions forming said housing, each of said cylindrical front and rear portions having an open and a closed end, said rear portion having mounting means extending therefrom so that said housing can be mounted in any one of first and second pairs of opposed orientations with said first pair of opposed orientations being perpendicular to said second pair of opposed orientations, a circuit board having an orientation sensitive component mounted thereon which must be mounted in the particular orientation to properly operate, said circuit board being rotatably mounted within said housing on said rear portion, circuit board engaging means included on said front portion mechanically connected to said circuit board so that rotation of said front portion rotates said circuit board, one of said front and rear housing portions having a plurality of slots along the periphery of said open end thereof with wedges intermediate said slots, the other of said front and rear housing portions having a plurality of interlocking lugs along the periphery of said open end thereof, said slots being formed to receive said lugs so that with said open ends of said front and rear portion joined together rotation of said front portion with respect to said rear portion acts to engage said wedges and said lugs, said wedges forming cams which engage said lugs so that rotation of said front portion in a clockwise direction acts to draw said front and rear portions together by cam action and position said orientation sensitive component in the particular orientation with said rear portion mounted in one of said first pair of orientations, said cams also engaging said lugs upon rotation of said front portion in a counterclockwise direction to draw said front and rear portions together by cam action and position said orientation sensitive component in the particular orientation with said rear portion mounted in one of said second pair of orientations.

8. The housing of claim 7 wherein one of said front and rear portions has a groove extending around the periphery of said open end thereof and a resilient seal positioned within said groove which only partially fills said groove, said periphery of said open end of said other housing portion fitting against said seal whereby said drawing together of said front and rear portions by cam action acts to compress said seal thereby causing it to extend outwardly within said groove to provide a water tight seal of said housing.

References Cited

UNITED STATES PATENTS

| | | | |
|---|---|---|---|
| 1,969,499 | 8/1934 | Bradshaw et al. ---- | 317—107X |
| 2,154,411 | 4/1939 | Road et al. ---------- | 317—107 |
| 2,675,040 | 4/1954 | Raun et al. -------- | 220—40X |
| 2,895,637 | 7/1959 | Bakke et al. -------- | 220—40 |

LEWIS H. MYERS, Primary Examiner

G. P. TOLIN, Assistant Examiner

U.S. Cl. X.R.

317—107